United States Patent
Zhang et al.

(10) Patent No.: US 10,495,678 B2
(45) Date of Patent: Dec. 3, 2019

(54) TESTING METHOD FOR SHEET RESISTANCE AND CONTACT RESISTANCE OF CONNECTING POINT OF SHEET MATERIAL

(71) Applicant: SHANGHAI INSTITUTE OF CERAMICS, CHINESE ACADEMY OF SCIENCES, Shanghai (CN)

(72) Inventors: Bufa Zhang, Shanghai (CN); Lixin Song, Shanghai (CN)

(73) Assignee: SHANGHAI INSTITUTE OF CERAMICS, CHINESE ACADEMY OF SCIENCES, Shanghai (CN)

(*) Notice: Subject to any disclaimer, the term of this patent is extended or adjusted under 35 U.S.C. 154(b) by 27 days.

(21) Appl. No.: 15/763,974

(22) PCT Filed: Sep. 28, 2016

(86) PCT No.: PCT/CN2016/100588
§ 371 (c)(1),
(2) Date: Mar. 28, 2018

(87) PCT Pub. No.: WO2017/054732
PCT Pub. Date: Apr. 6, 2017

(65) Prior Publication Data
US 2018/0275178 A1  Sep. 27, 2018

(30) Foreign Application Priority Data

Sep. 29, 2015  (CN) .......................... 2015 1 0638371

(51) Int. Cl.
*G01R 27/02* (2006.01)
*G01R 27/20* (2006.01)
*G01R 31/02* (2006.01)

(52) U.S. Cl.
CPC ......... *G01R 27/025* (2013.01); *G01R 27/205* (2013.01); *G01R 31/02* (2013.01)

(58) Field of Classification Search
CPC .... G01R 27/025; G01R 31/02; G01R 27/205; G01R 27/02
(Continued)

(56) References Cited

U.S. PATENT DOCUMENTS 5,184,398 A * 2/1993 Moslehi .............. C23C 16/4583
257/E21.531
2015/0260670 A1 * 9/2015 Shu ...................... G01N 27/041
324/693

FOREIGN PATENT DOCUMENTS

CN  101281218 A  10/2008
CN  101859720 A  10/2010
(Continued)

OTHER PUBLICATIONS

Chinese National Standard "GB/T 15078-2008 Testing Method for Contact Resistance of Precious Metals Electrical Contact Materials", which published on Mar. 31, 2008, 9 pages.
(Continued)

*Primary Examiner* — Melissa J Koval
*Assistant Examiner* — Trung Nguyen
(74) *Attorney, Agent, or Firm* — Alleman Hall Creasman & Tuttle LLP

(57) ABSTRACT

A testing method for the sheet resistance and contact resistance of connecting point of a sheet material, comprising: mounting at least four small electrodes on the surface of the sheet material; measuring the resistance between the electrodes; and calculating the sheet resistance and electrode contact resistance of the sheet material on the basis of a theoretical model from the resistance measured between the electrodes and the distances between the electrodes. As a
(Continued)

main feature, the testing method is a convenient nondestructive testing method for the sheet resistance and electrode contact resistance of the sheet material, and has no strict requirement on the distribution of electrodes.

16 Claims, 6 Drawing Sheets

(58) Field of Classification Search
USPC .......... 324/600, 691–693; 200/207.21, 252, 200/500, 525, 549, 727
See application file for complete search history.

(56) References Cited

FOREIGN PATENT DOCUMENTS

| | | |
|---|---|---|
| CN | 102735939 A | 10/2012 |
| CN | 103884912 A | 6/2014 |
| CN | 105203847 A | 12/2015 |
| JP | 4586646 B | 11/2010 |

OTHER PUBLICATIONS

Chinese National Standard "GB/T 14141-2009 Test Method for Sheet Resistance of Silicon Epitaxial Diffused and Ion-Implanted Layers Using a Collinear Four-Probe Array", which published on Oct. 30, 2009, 10 pages.
ISA State Intellectual Property Office of the People's Republic of China, International Search Report Issued in PCT Application No. PCT/CN2016/100588, Dec. 30, 2016, WIPO, 4 pages.

* cited by examiner $$R_{AB} = \frac{R_\square}{2\pi} \ln\left[\frac{L_{AB}^2 - r_A^2 - r_B^2}{2 r_A r_B} + \sqrt{\left(\frac{L_{AB}^2 - r_A^2 - r_B^2}{2 r_A r_B}\right)^2 - 1}\right] \quad (1)$$

$$R_{AB} = \frac{R_\square}{\pi} \ln(L_{AB}) + \frac{R_\square}{2\pi} \ln\left(\frac{1}{r_A}\right) + \frac{R_\square}{2\pi} \ln\left(\frac{1}{r_B}\right) \quad (2)$$

$$R_{ABm} = \frac{R_\square}{\pi} \ln(L_{AB}) + \left[\frac{R_\square}{2\pi} \ln\left(\frac{1}{r_A}\right) + R_{LA}\right] + \left[\frac{R_\square}{2\pi} \ln\left(\frac{1}{r_B}\right) + R_{LB}\right]$$

$$= \frac{R_\square}{\pi} \ln(L_{AB}) + R_{CA} + R_{CB} \quad (3)$$

$$R_{12m} = \frac{R_\square}{\pi} \ln(L_{12}) + R_{C1} + R_{C2} \quad (4)$$

$$R_{13m} = \frac{R_\square}{\pi} \ln(L_{13}) + R_{C1} + R_{C3} \quad (5)$$

$$R_{14m} = \frac{R_\square}{\pi} \ln(L_{14}) + R_{C1} + R_{C4} \quad (6)$$

$$R_{23m} = \frac{R_\square}{\pi} \ln(L_{23}) + R_{C2} + R_{C3} \quad (7)$$

$$R_{24m} = \frac{R_\square}{\pi} \ln(L_{24}) + R_{C2} + R_{C4} \quad (8)$$

$$R_{34m} = \frac{R_\square}{\pi} \ln(L_{34}) + R_{C3} + R_{C4} \quad (9)$$

$$\chi^2 = (R_{12m} - R_{12t})^2 + (R_{13m} - R_{13t})^2 + (R_{14m} - R_{14t})^2$$

$$+ (R_{23m} - R_{23t})^2 + (R_{24m} - R_{24t})^2 + (R_{34m} - R_{34t})^2 \quad (10)$$

FIG. 4

$$3R_{C1} + R_{C2} + R_{C3} + R_{C4} + (lnL_{12} + lnL_{13} + lnL_{14})\frac{R_\square}{\pi} = R_{12t} + R_{13t} + R_{14t} \quad (11)$$

$$R_{C1} + 3R_{C2} + R_{C3} + R_{C4} + (lnL_{12} + lnL_{23} + lnL_{24})\frac{R_\square}{\pi} = R_{12t} + R_{23t} + R_{24t} \quad (12)$$

$$R_{C1} + R_{C2} + 3R_{C3} + R_{C4} + (lnL_{13} + lnL_{23} + lnL_{34})\frac{R_\square}{\pi} = R_{13t} + R_{23t} + R_{34t} \quad (13)$$

$$R_{C1} + R_{C2} + R_{C3} + 3R_{C4} + (lnL_{14} + lnL_{24} + lnL_{34})\frac{R_\square}{\pi} = R_{14t} + R_{24t} + R_{34t} \quad (14)$$

$$(lnL_{12} + lnL_{13} + lnL_{14})R_{C1} + (lnL_{12} + lnL_{23} + lnL_{24})R_{C2} + (lnL_{13} + lnL_{23} + lnL_{34})R_{C3} + (lnL_{14} + lnL_{24} + lnL_{34})R_{C4} + [(lnL_{12})^2 + (lnL_{13})^2 + (lnL_{14})^2 + (lnL_{23})^2 + (lnL_{24})^2 + (lnL_{34})^2]\frac{R_\square}{\pi} = R_{12t}lnL_{12} + R_{13t}lnL_{13} + R_{14t}lnL_{14} + R_{23t}lnL_{23} + R_{24t}lnL_{24} + R_{34t}lnL_{34} \quad (15)$$

$$R_{12m+34m} = R_{12m} + R_{34m}$$
$$= \frac{R_\square}{\pi} ln(L_{12}L_{34}) + R_{C1} + R_{C2} + R_{C3} + R_{C4} \quad (16)$$

$$R_{13m+24m} = R_{13m} + R_{24m}$$
$$= \frac{R_\square}{\pi} ln(L_{13}L_{24}) + R_{C1} + R_{C2} + R_{C3} + R_{C4} \quad (17)$$

$$R_{14m+23m} = R_{14m} + R_{23m}$$
$$= \frac{R_\square}{\pi} ln(L_{14}L_{23}) + R_{C1} + R_{C2} + R_{C3} + R_{C4} \quad (18)$$

FIG. 5

$$R_\square = \pi \frac{R_{12t+34t} - R_{12t+34t}}{\ln(L_{12}L_{34}) - \ln(L_{13}L_{24})} \tag{19}$$

$$R_{C1} + R_{C2} + R_{C3} + R_{C4} = \frac{R_{12t+34t}\ln(L_{12}L_{34}) - R_{13t+24t}\ln(L_{13}L_{24})}{\ln(L_{13}L_{24}) - \ln(L_{12}L_{34})} \tag{20}$$

FIG. 6

TESTING METHOD FOR SHEET RESISTANCE AND CONTACT RESISTANCE OF CONNECTING POINT OF SHEET MATERIAL

FIELD OF THE INVENTION

The present invention relates to a method for testing the sheet resistance and contact resistance of connecting point of a conductive sheet material. The sheet material comprises a monolayer or multilayer of conductive material, possibly a metal material, an alloy material, a semiconductor material, a coating material, and a thin film material. The material may be stand-alone or supported by a non-conductive substrate.

BACKGROUND OF THE INVENTION

Sheet resistance is one of the important properties of a sheet material, the precise measurement of which is an important means to assess and monitor the semiconductor material. Meanwhile, sheet materials are widely used in the fabrication of electronic components, and the sheet resistance performance thereof directly affects the quality of the component. Sheets of metal materials, alloy materials, and semiconductor materials, and electrically conductive coating materials on a substrate are applied to the semiconductor component fabrication and electronic circuit connection, as well as the surface modification and protection of objects.

A connecting point is a small-area contact or connection between two objects, for the purpose of transmitting current. A connecting point may refer to a contact between a measurement probe and the surface of a sheet material by pressure, or a connection means between a lead and the surface of a sheet material by tin soldering (or by conducting epoxy resin), or a connection means between different objects by a warming/melting/cooling process. In addition, crystal whisker roots grown on the surface of a material can also be regarded as a connecting point. The current Chinese National Standard "GB/T 14141-2009 TEST METHOD FOR SHEET RESISTANCE OF SILICON EPITAXIAL, DIFFUSED AND ION-IMPLANTED LAYERS USING A COLLINEAR FOUR-PROBE ARRAY" has made detailed requirements on the four-probe method for testing the sheet resistance of semiconductor materials, that the probe tip should have a hemispherical shape (with a radius of 35 μm-250 μm) or a flat circular section (with a radius of 50 μm-125 μm).

The potential field in the sample generated by the two terminal electrodes in the collinear four-probe array method is unavoidably affected by the two middle measuring electrodes. This standard strictly requires that the distance between adjacent probes be 1.59 mm, which limits the application range of the sample. Repeated testing is required to ensure the reliability of measurement results as well as to improve the measurement accuracy, as the shape of the indentation by the probe on the surface of the tested material is difficult to control. In short, the process using collinear four-probe array method for measuring the sheet resistance of a sheet material is complicated, and demanding on the measurement instruments and operation skills, which limits its application.

In addition, the Chinese National Standard "GB/T 15078-2008 TESTING METHOD FOR CONTACT RESISTANCE OF PRECIOUS METALS ELECTRICAL CONTACT MATERIALS" specifies the measurement of (static) contact resistance between a probe made of precious metals and their alloy materials and a bulk material in detail. However, this standard does not apply to a sheet material due to the relatively high resistance of the sheet material itself. The connection at the cross-section of the connecting point is usually estimated from experience or analyzed by slicing. There is currently no standard method for measuring the contact resistance of the connecting point of a sheet material.

SUMMARY OF THE INVENTION

In view of the above disadvantages presented in the prior art, the technical problem to be solved by the present application is to provide a testing method for the sheet resistance and the contact resistance of a connecting point of a sheet material, which is a non-destructive testing method in which the electrodes for measurement can be dispersedly distributed, and the influence from other electrodes on the potential field generated by the electrodes for measurement can be reduced, compared with the standard collinear four-probe array method currently used.

In order to solve the above technical problem, provided is a testing method for the sheet resistance and the contact resistance of a connecting point of a sheet material in the present application, comprising: mounting at least four electrodes on the surface of the sheet material; measuring the resistances between the electrodes; and calculating the sheet resistance and the electrode contact resistance of the sheet material on the basis of a theoretical model from the resistances measured between the electrodes and the distances between the electrodes.

According to the present application, a number of different electrode pairs can be made from four or more small electrodes mounted on a sheet material, and the sheet resistance and electrode contact resistance of a sheet material can be calculated by using a theoretical model and measuring resistances between the different electrode pairs. This method has the main features of being simple and convenient, being a non-destructive testing method for sheet resistance and electrode contact resistance of sheet materials, and that there is no strict requirement on the electrodes distribution.

Further, in the present application, the sheet material may be an electrically conductive material, including metal material, alloy material, semiconductor material, coating, or film material.

Further, in the present application, the sheet material may include monolayer material or multilayer material, and the sheet material may be stand-alone or supported by a non-conductive substrate.

Further, in the present application, the electrode may be the connection means between the sheet material and a circuit, and the electrode may be connected to the sheet material by pressure-contact, gluing, soldering, or electric welding of the surface of a sheet material.

Further, in the present application, the thickness of the sheet material may be uniform, preferably with an unevenness of less than 1%; and the thickness of the sheet material is much smaller than the diameters of the electrodes; preferably, the thickness of the sheet material is smaller than $1/10$ of the smallest diameter of the electrodes.

According to the present application, the potential and current in the sheet material generated by the electrodes is uniform in the depth direction, and the theoretical analysis thereof can be treated mathematically as a two-dimensional problem.

Further, in the present application, the distance between the electrodes may be much greater than the diameters of the electrodes, preferably, the minimum distance between the electrodes is greater than 5 times the maximum diameter of the electrodes.

Further, in the present application, the planar dimensions of the sheet material may be much greater than the distance between the electrodes, preferably greater than 10 times the maximum distance between the electrodes, and the planar dimensions can be the length, the width, or the diameter of the sheet material.

Further, in the present application, the distance between the electrode and the edge of the sheet material is much greater than the distance between the electrodes, and preferably greater than 5 times the maximum distance between the electrodes.

According to the present application, the planar dimensions of the sheet material are much greater than the distance between the electrodes, and the distance between each electrode and the edge of the material is much greater than the distance between the electrodes. Therefore, the potential and electric current at the edge of the material are very small and the edge reflection effect can be neglected.

In addition, the present application requires that the conductivity of the electrode material be much greater than that of the sheet material, and the potential within the electrodes can be considered to be uniform.

In the present application, the sheet resistance and the electrode contact resistance of the sheet material may be calculated from the measured resistances between the electrodes and the distance between the electrodes using a least-squares linear fitting technique with a theoretical model.

In the present application, when the planar size of the sheet material is small, the resistance between the electrodes can be calculated, in the theoretical model, by using a mirror image method (for example, for rectangular sheet materials), a conformal mapping method (such as for circular sheet materials) or other mathematical methods.

The present application reduces the influence from other electrodes on the potential field generated by the electrodes for measurement, compared with the standard collinear four-probe array method currently used.

The foregoing and other objects, features, and advantages of the present application will be better recognized with the following detailed description with reference to the drawings.

BRIEF DESCRIPTION OF THE DRAWINGS

The simulated contact resistances of the electrode surfaces are $R_{c1}=1$, $R_{c2}=0.5$, $R_{c3}=0.7$, and $R_{c4}=0.3$. Any unit can be used in the distance measurement, and the same measurement unit is required to be used in each distance measurement. The unit of the calculated sheet resistance is same as the measurement unit of the resistance measured between the electrodes. FIGS. 4-6 contain the related equations used in the present application.

Reference numbers:

1—Sheet material; 2—Electrode A; 3—Electrode B; 4—Electrode leads; 12—First electrode; 13—Second electrode; 14—Third electrode; 15—Fourth electrode; 16—Electrode leads.

DETAILED DESCRIPTION OF THE EMBODIMENTS

The present invention will be further described below with reference to the accompanying drawings and the following embodiments. It should be understood that the accompanying drawings and the following embodiments are only used for describing the present invention rather than limiting the present invention.

Figure 1:
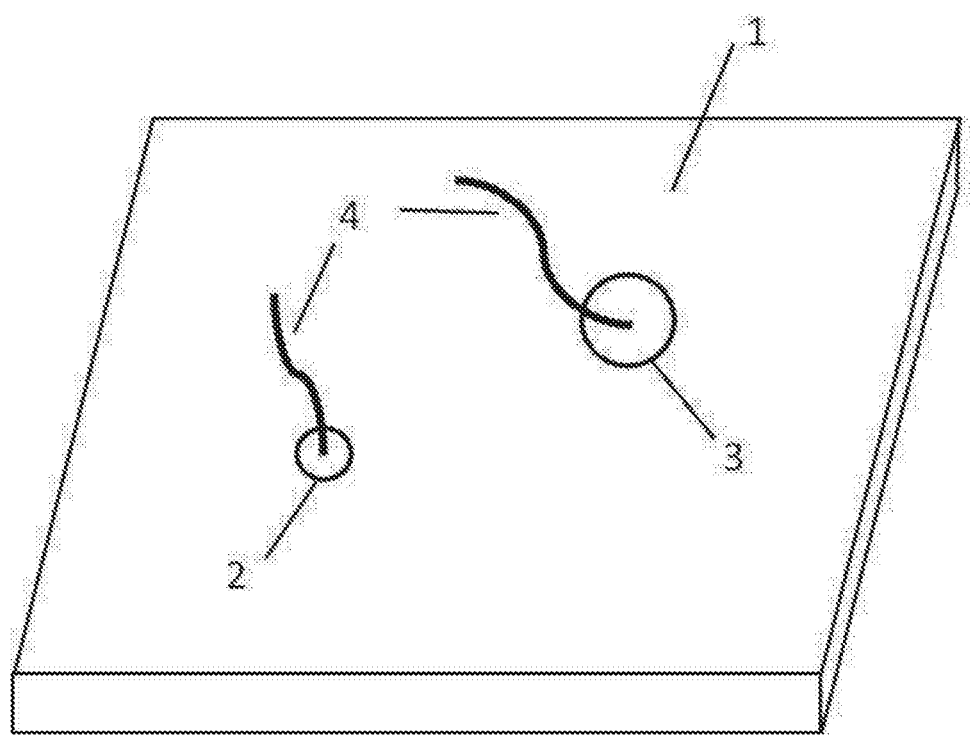
FIG. 1 is a schematic view of a method for measuring the sheet resistance of a sheet material with two circular electrodes.
Figure 2:
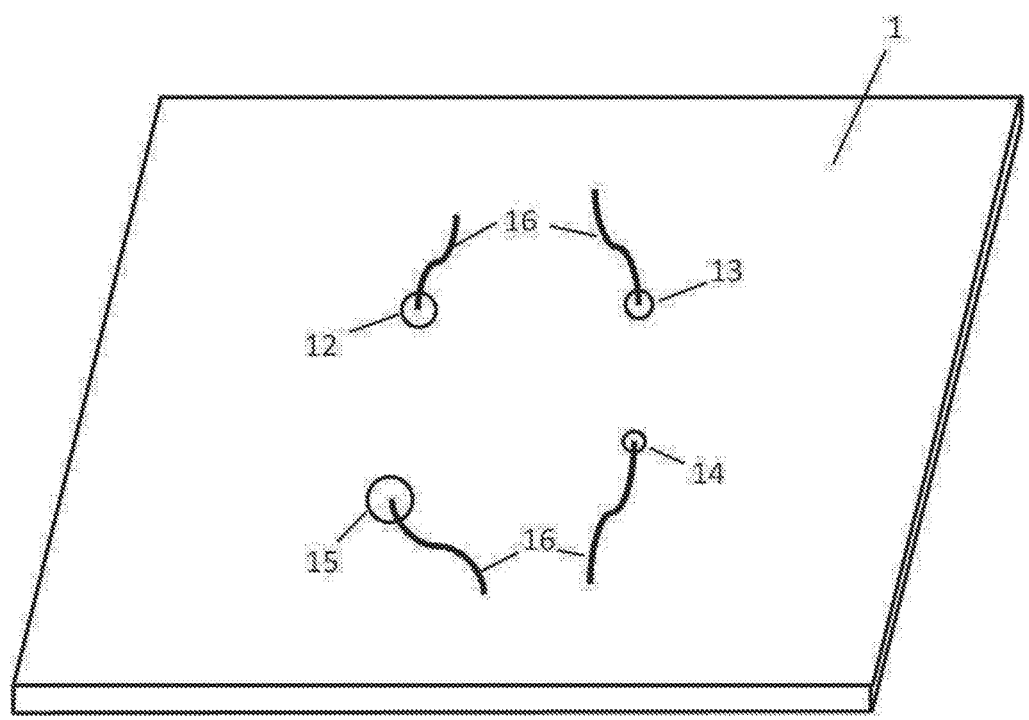
FIG. 2 is a schematic view of a method for measuring the sheet resistance and the electrode contact resistance of a sheet material with four small electrodes.
Figure 3:
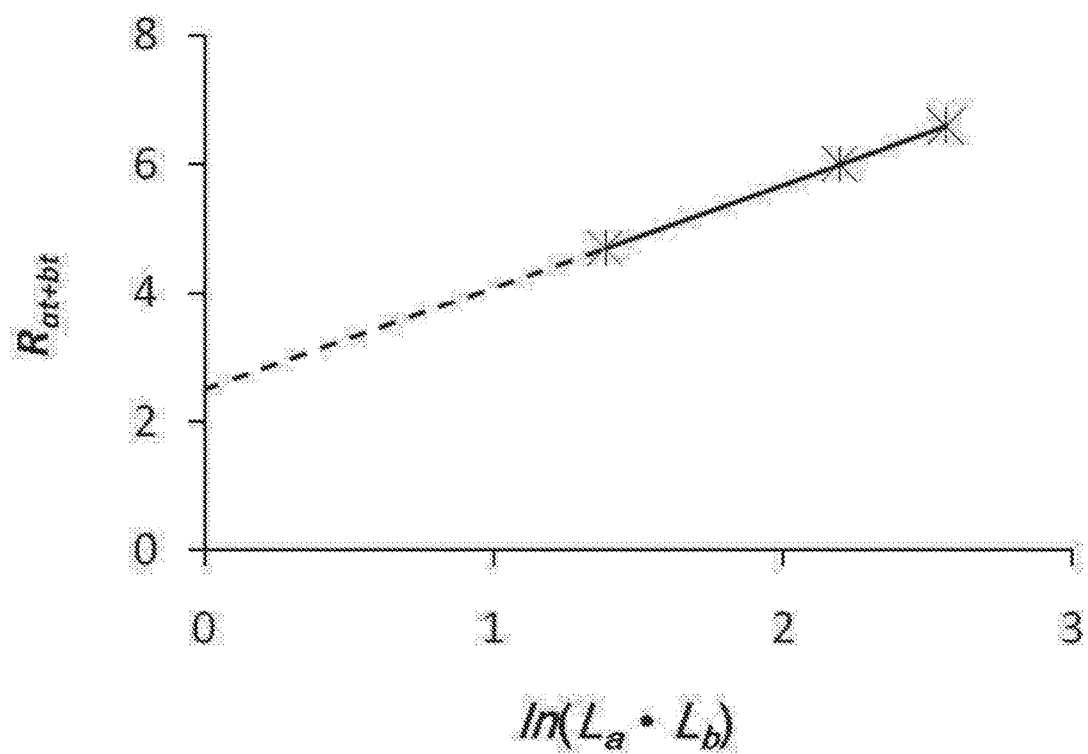
FIG. 3 is an illustrative diagram of calculating the sheet resistance of a sheet material by a least-squares linear fitting method. $L_a$ and $L_b$ are the distances between the electrodes of two electrode pairs, respectively, and $R_{at+bt}$ is the sum of the measured resistances between the electrodes of the two electrode pairs. The subscripts a and b represent different pairs of electrodes. The three simulated measurement points (asterisk-shaped) are obtained from the following simulated measurement conditions: four small electrodes are mounted on the surface of the sheet material; and the electrodes are located at the four corners of a rectangle with a length of 3 and a width of 2; wherein the distances between the electrodes are respectively $L_{12}=3$, $L_{13}=\sqrt{13}$, $L_{14}=2$, $L_{23}=2$, $L_{24}=\sqrt{13}$, and $L_{34}=3$.

FIG. 1 is a schematic view of a method for measuring the sheet resistance of a sheet material with two circular electrodes. Wherein the radii of electrode A (i.e., the electrode 2 on the left in FIG. 1) and electrode B (i.e., the electrode 3 on the right in FIG. 1) are $r_A$ and $r_B$, respectively, and the distance between the centers of the two electrodes is $L_{AB}$. FIG. 2 is a schematic view of a method for measuring the sheet resistance and the electrode contact resistance of a sheet material with four small electrodes. FIG. 3 demonstrates the sheet resistance calculation of a sheet material by a least-squares linear fitting method. $L_a$ and $L_b$ are the distances between the electrodes of two electrode pairs, respectively, and $R_{at+bt}$ is the sum of the measured resistances between the electrodes of the two electrode pairs. The subscripts a and b represent different pairs of electrodes.

In view of the issues in the prior art, the present application provides a testing method for the sheet resistance and the contact resistance of a connecting point of a sheet material: mounting at least four electrodes on the surface of the sheet material; measuring the resistances between the electrodes; and calculating the sheet resistance and the electrode contact resistance of the sheet material, on the basis of a theoretical model, from the resistances measured between the electrodes and the distances between the electrodes.

The testing method for sheet resistance and electrode contact resistance of sheet material in the present application is a non-destructive testing method in which the electrodes for measurement can be dispersedly distributed, and the influence from other electrodes on the potential field generated by the electrodes for measurement can be reduced, compared with the standard collinear four-probe array method currently used.

In the present application, the electrode refers to the connection means between the sheet material and a circuit, including pressure-contact, gluing, soldering, electric welding, and other connection modes between the sheet material and the electric conductor.

In the present application, it is required that the thickness of the sheet material be much smaller than the diameter of the electrodes; therefore, in the present application, it is considered that the potential and current in the sheet material generated by the electrodes are uniform in the depth direction, and thus the theoretical analysis thereof can be treated mathematically as a two-dimensional problem. The planar dimensions of the sheet material are much greater than the distances between the electrodes, and the distance between each electrode and the edge of the material is much greater than the distances between the electrodes. Therefore, the potential and current at the edge of the material is very small and the edge reflection effect can be neglected. It is required in the present application that the conductivity of the electrode material be much greater than the conductivity of the sheet material, and thus the potential within the electrodes can be considered to be uniform (see FIG. 1).

The study found that the resistance $R_{AB}$ in the sheet material between the two electrodes can be calculated according to equation (1) in FIG. 4.

Herein, $r_A$ and $r_B$ are the radii of electrode A and electrode B respectively, $L_{AB}$ is the distance between the centers of the two electrodes, and $R_\square = \rho/t$ is the sheet resistance of the sheet material, wherein $\rho$ and $t$ are the resistivity and the thickness of the sheet material, respectively (see FIG. 1). $\pi=3.1416$ is the constant of pi.

In the case of small electrodes, $r_A \ll L_{AB}$, and $r_B \ll L_{AB}$, thus equation (1) can be approximately expressed as equation (2) in FIG. 4.

Equation (2) shows that in the case of small electrodes, the resistance in the sheet material between the two electrodes consists of three parts, the first part being related to the sheet resistance ($R_\square$) of the sheet material and the distance ($L_{AB}$) between the electrodes, and other parts being related to the sheet resistance of the sheet material and the radii ($r_A$ and $r_B$) of the electrodes.

In many cases, the position of the small electrode and its effective contact area with the sheet material are difficult to be precisely controlled during the preparation of the sample to be tested. In addition, the interface resistance at the contact position between the small electrode and the sheet material cannot be neglected, thus equation (2) cannot apply directly to the measurement of the sheet resistance of the sheet material. The resistance between the two electrodes in the actual measurement can be expressed as equation (3) in FIG. 4.

Herein, $R_{IA}$ and $R_{IB}$ are respectively the interface contact resistances between the two electrodes and the sheet material, and $R_{CA}$ and $R_{CB}$ are the total contact resistances of the two electrodes and the sheet material, respectively.

For a particular measurement system, equation (3) shows that the resistance between the electrodes consists of three parts: the first part is related to the sheet resistance of the sheet material and the distance between the electrodes, and the other two parts are related to the sheet resistance of the sheet material, the radii of the electrodes, and the contact resistance of the electrode/sheet material interface.

In the present application, four or more electrodes are mounted on the surface of the sheet material, from which a number of electrode pair combinations can be made. For example, four electrodes may form up to six different pairs of electrodes, and five electrodes can make up to ten different pairs of electrodes. In the measurement system shown in FIG. 2, six independent resistance measurements can be made between the four electrodes. The resistance between the electrode pairs can be described as equations (4)-(9) in FIG. 4.

Herein, subscripts 1, 2, 3, and 4 represent different electrodes, respectively. In the experiment, the distance between the electrodes can be measured, so there are five unknowns in the above equations, i.e., $R_{C1}$, $R_{C2}$, $R_{C3}$, $R_{C4}$, and $R_\square$.

By comparing the resistances measured between the electrodes and the theoretical model, the above five unknowns can be calculated using the least-squares method of minimum variance. For the measurement system shown in FIG. 2, the variance between the experimental measurements and the theoretical model can be described as equation (10) in FIG. 4.

Herein, $R_{12t}$, $R_{13t}$, $R_{14t}$, $R_{23t}$, $R_{24t}$, and $R_{34t}$ are the six resistances measured between the electrodes, respectively, and subscripts 1, 2, 3, and 4 represent the different electrodes, respectively.

The partial derivatives of $x^2$ with respect to $R_{C1}$, $R_{C2}$, $R_{C3}$, $R_{C4}$, and $R_\square$, are found and set to zero, to give equations (11)-(15) in FIG. 5.

From the above equations, $R_{C1}$, $R_{C2}$, $R_{C3}$, $R_{C4}$, and $R_\square$, can be calculated separately, thus the electrode contact resistance and the sheet resistance of the sheet material can be determined. If the radius of the contact area between the electrode and the sheet material is known, the interface contact resistance between the electrode and the sheet material can be further determined by equation (3).

The sheet resistance of the sheet material can also be determined by a simpler and faster linear fitting method. Equations (4)-(9) are rearranged to obtain equations (16)-(18) in FIG. 5.

The six resistances $R_{12t}$, $R_{13t}$, $R_{14t}$, $R_{23t}$, $R_{24t}$, and $R_{34t}$ measured between the electrodes are compared with the theoretical model (equations (16)-(18)), then the sheet resistance of the sheet material $R_\square$, and the sum of the electrode contact resistances $R_{C1}+R_{C2}+R_{C3}+R_{C4}$ can be determined by selecting any two equations to compare with the resistances measured between the electrodes, and thus the measurement error resulting from the electrode contact resistance can be eliminated. For example, see equations (19) and (20) in FIG. 6.

In addition, three points ($\ln(L_{12}L_{34})$, $R_{12t+34t}$), $\ln(L_{13}L_{24})$, $R_{13t+24t}$), and ($\ln(L_{14}L_{23})$, $R_{14t+23t}$) are plotted in Cartesian coordinates and linearly fitted to a straight line as shown in FIG. 3. According to equations (16)-(18), the slope of this line is $R_\square/\pi$ and the intercept of the line in the Y-axis is $R_{C1}+R_{C2}+R_{C3}+R_{C4}$. Therefore, the sheet resistance of the sheet material can be determined from the slope of the fitted straight line, eliminating the measurement error caused by the electrode contact resistance.

The method for measuring the sheet resistance and the electrode contact resistance of a sheet material with multiple electrodes as described in this application is also applicable to the case of non-circular contact points since the newly invented method utilizes the far-field approximation of the electric field generated by the small electrode. In the resistance measurement of the electrode pair, one electrode is in the far field of the potential field generated by the other electrode, and the potential field generated by a small, non-circular electrode may be approximately equivalent to the potential field generated by a small, circular electrode.

The method for measuring the sheet resistance and the electrode contact resistance of a sheet material with multiple electrodes as described in this application is also applicable in the case of more than four electrodes. The measuring principle and procedure are similar to those of the four electrodes described above. In the measuring system with n electrodes, up to $n(n-1)/2$ different electrode pairs can be made so that $n(n-1)/2$ independent resistance measurements between electrodes can be performed.

The method for measuring the sheet resistance and the electrode contact resistance of a sheet material with multiple electrodes as described in this application is, in some cases, applicable to a sheet material with a small planar size, in which the resistance between the electrodes can be calculated by using a mirror image method (for example, for rectangular sheet materials), a conformal mapping method (such as for circular sheet materials), or other mathematical transformation methods.

The invention can be embodied in many forms without departing from the essential nature of the application, and the embodiments of the application are intended to be illustrative and not restrictive. The scope of the invention is defined by the claims rather than the specifications, and all modifications which fall within the scope of the claims, or equivalents of the scope of the invention, are to be included in the claims.

The invention claimed is:

1. A testing method for a sheet resistance and an electrode contact resistance of a sheet material, comprising:
    mounting at least four electrodes, including a first electrode and a second electrode, on a surface of the sheet material;
    measuring resistances between the at least four electrodes; and
    calculating the sheet resistance and the electrode contact resistance of the sheet material on the basis of the following equation from the resistances measured between the at least four electrodes and distances between the at least four electrodes, $$R_{ABm} = \frac{R_\square}{\pi}\ln(L_{AB}) + \left[\frac{R_\square}{2\pi}\ln\left(\frac{1}{r_A}\right) + R_{IA}\right] + \left[\frac{R_\square}{2\pi}\ln\left(\frac{1}{r_B}\right) + R_{IB}\right] = \frac{R_\square}{\pi}\ln(L_{AB}) + R_{CA} + R_{CB}$$

wherein, $R_{ABm}$ is a resistance between the first electrode and the second electrode, $R_\square$ is the sheet resistance of the sheet material, $r_A$ and $r_B$ are radii of the first electrode and the second electrode respectively, $L_{AB}$ is a distance between the first electrode and the second electrode, $R_{IA}$ is an interface contact resistance between the first electrode and the sheet material, $R_{IB}$ is an interface contact resistance between the second electrode and the sheet material, $R_{CA}$ is a total contact resistance between the first electrode and the sheet material, and $R_{CB}$ is a total contact resistance between the second electrode and the sheet material.

2. The testing method according to claim 1, wherein the sheet material is a conductive material, including metal material, alloy material, semiconductor material, coating, or film material.

3. The testing method according to claim 1, wherein the sheet material includes monolayer material or multilayer material, and the sheet material is stand-alone or supported by a non-conductive substrate.

4. The testing method according to claim 1, wherein the first electrode and the second electrode are connection means between the sheet material and a circuit, and the first electrode and the second electrode are connected to the sheet material by pressure-contact, gluing, soldering, or electric welding of the surface of the sheet material.

5. The testing method according to claim 1, wherein a thickness of the sheet material is uniform; and wherein the thickness of the sheet material is much less than diameters of the first electrode and the second electrode.

6. The testing method according to claim 1, wherein the distance between the first electrode and the second electrode is much greater than diameters of the first electrode and the second electrode.

7. The testing method according to claim 1, wherein planar dimensions of the sheet material are much greater than the distance between the first electrode and the second electrode; and wherein the planar dimensions are a length, a width, or a diameter of the sheet material.

8. The testing method according to claim 1, wherein the distance between the first electrode or the second electrode and an edge of the sheet material is much greater than the distance between the first electrode and the second electrode.

9. The testing method according to claim 1, wherein the sheet resistance and the electrode contact resistance of the sheet material are calculated from the resistances measured between the at least four electrodes and the distances between the at least four electrodes using a minimum-variance method according to a theoretical model.

10. The testing method according to claim 1, wherein the sheet resistance of the sheet material is calculated from the resistances measured between the at least four electrodes and the distances between the at least four electrodes using a least-squares linear fitting method according to a theoretical model.

11. The testing method according to claim 1, wherein the resistance between the first electrode and the second electrode is calculated using a mirror image method for a rectangular sheet material, or using a conformal mapping method for a circular sheet material, when a planar size of the sheet material is small.

12. The testing method according to claim 5, wherein the thickness of the sheet material has an unevenness of less than 1%.

13. The testing method according to claim 5, wherein the thickness of the sheet material is less than 1/10 of a smallest diameter of the at least four electrodes.

14. The testing method according to claim 6, wherein a minimum distance between the at least four electrodes is greater than 5 times a maximum diameter of the at least four electrodes.

15. The testing method according to claim 7, wherein the planar dimensions of the sheet material are greater than 10 times a maximum distance between the at least four electrodes.

16. The testing method according to claim 8, wherein the distance between the first electrode or the second electrode and the edge of the sheet material is greater than 5 times a maximum distance between the electrodes.

* * * * *